United States Patent
Kuesel

(10) Patent No.: US 10,566,277 B2
(45) Date of Patent: Feb. 18, 2020

(54) METHODS FOR SEMICONDUCTOR COMPONENT DESIGN AND FOR SEMICONDUCTOR COMPONENT PRODUCTION AND CORRESPONDING SEMICONDUCTOR COMPONENTS

(71) Applicant: Infineon Technologies AG, Neubiberg (DE)

(72) Inventor: Andreas Kuesel, Munich (DE)

(73) Assignee: Infineon Technologies AG, Neubiberg (DE)

(*) Notice: Subject to any disclaimer, the term of this patent is extended or adjusted under 35 U.S.C. 154(b) by 113 days.

(21) Appl. No.: 15/592,862

(22) Filed: May 11, 2017

(65) Prior Publication Data

US 2017/0352617 A1    Dec. 7, 2017

(30) Foreign Application Priority Data

Jun. 6, 2016  (DE) .................. 10 2016 110 384

(51) Int. Cl.
| | |
|---|---|
| *H01L 23/52* | (2006.01) |
| *H01L 29/66* | (2006.01) |
| *H01L 23/522* | (2006.01) |
| *H01L 29/06* | (2006.01) |
| *H01L 29/16* | (2006.01) |
| *H01L 29/43* | (2006.01) |
| *H01L 29/861* | (2006.01) |

(52) U.S. Cl.
CPC ...... *H01L 23/5222* (2013.01); *H01L 29/0619* (2013.01); *H01L 29/1608* (2013.01); *H01L 29/43* (2013.01); *H01L 29/6606* (2013.01); *H01L 29/861* (2013.01)

(58) Field of Classification Search
CPC .... G06F 17/50; G06F 17/507; G06F 17/5072; H01L 29/06; H01L 29/061; H01L 29/0619; H01L 29/16; H01L 29/16; H01L 29/1608; H01L 29/43; H01L 29/66; H01L 29/66; H01L 29/6606; H01L 29/86; H01L 29/861; H01L 29/94; H01L 27/02; H01L 27/02; H01L 27/0207; H01L 23/52; H01L 23/522; H01L 23/5222; H01L 23/5223
USPC ................................. 257/768, 758
See application file for complete search history.

(56) References Cited

U.S. PATENT DOCUMENTS

| | | |
|---|---|---|
| 9,083,325 B2 | 7/2015 | Datta et al. |
| 2006/0218517 A1 | 9/2006 | Siegler et al. |
| 2014/0368247 A1 | 12/2014 | Datta et al. |

(Continued)

FOREIGN PATENT DOCUMENTS

DE   10339283 A1   4/2005

OTHER PUBLICATIONS

"Design Closure," Wikipedia, the free encyclopedia, retrieved from https://en.wikiepedia.org/wiki/Design_closure on May 11, 2017, last revised Apr. 28, 2017, 4 pp.

(Continued)

*Primary Examiner* — Monica D Harrison
(74) *Attorney, Agent, or Firm* — Shumaker & Sieffert, P.A.

(57) ABSTRACT

Methods for designing semiconductor components, for fabricating semiconductor components, and corresponding semiconductor components are provided. In this case, capacitance structures are either coupled to a supply network or used for rectifying design violations.

18 Claims, 3 Drawing Sheets

(56) References Cited

U.S. PATENT DOCUMENTS

Figure 1:
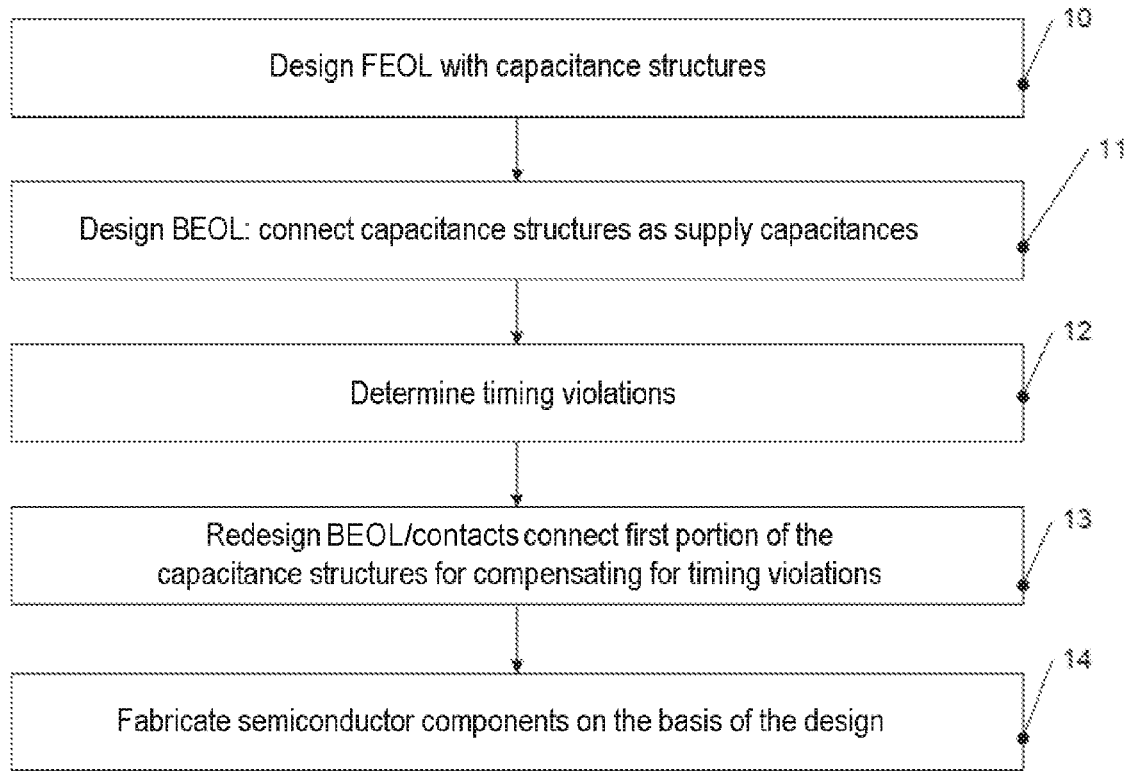

2016/0190208 A1* 6/2016 Nazarian .............. G11C 13/003
257/5

OTHER PUBLICATIONS

"Design Closure," Wikipedia, the free encyclopedia, retrieved from https://en.wikipedia.org/w/index.php?title=design_closure&oldid=70 on Apr. 6, 2017, last revised Jan. 2016, 3 pp.

Office Action, in the German language, from counterpart German Patent Application No. 102016110384.5 dated Apr. 7, 2017, 12 pp.

* cited by examiner

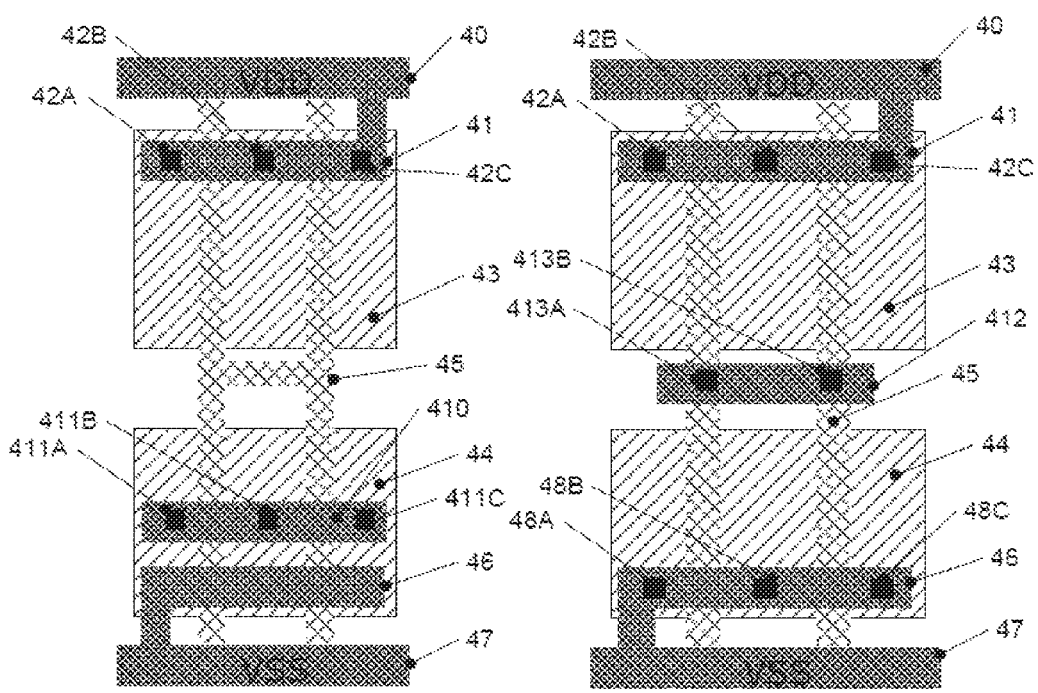

METHODS FOR SEMICONDUCTOR COMPONENT DESIGN AND FOR SEMICONDUCTOR COMPONENT PRODUCTION AND CORRESPONDING SEMICONDUCTOR COMPONENTS

The present application relates to methods for designing semiconductor components, and a corresponding computer program, a method for producing semiconductor components, and correspondingly produced semiconductor components. In particular, the present application relates to such methods and semiconductor components in which timing violations in digital circuit paths can be corrected at a relatively late stage.

At the end of a chip design cycle, design rule violations are often still present, which must be corrected before the semiconductor component (for example a semiconductor chip having an integrated circuit) can be produced. Such design rule violations may be, in particular, timing violations such as set-up violations and hold violations.

In this case, the production of semiconductor components in these process steps requires various masks used to define structures to be produced. A semiconductor production process is generally subdivided into front-end-of-line (FEOL) and back-end-of-line (BEOL). FEOL contains all process steps up to the first metal layer, the first metal layer no longer being considered part of FEOL. BEOL correspondingly contains all process steps starting from the first metal layer. Consequently, for all structures of a semiconductor component it is clear whether it is an FEOL structure, i.e. produced during the FEOL processes, or a BEOL structure, i.e. produced during the BEOL processes.

Toward the end of the FEOL processes, contact regions are also produced here, which serve for electrically coupling FEOL structures to metal layers, in particular a first metal layer. Such contact regions are produced temporally after the formation of diffusion regions and the formation of polycrystalline regions, but before the formation of the first metal layer. In the context of this application, the term "FEOL without contact formation" is used to denote the FEOL processes and/or FEOL structures with the exception of said contact regions and the formation of the contact regions.

The design process involves firstly releasing masks for the FEOL processes. The BEOL masks, in particular masks for metal layers, are usually not required until a few weeks later. Therefore, it is desirable to be able to correct final design rule violations, in particular timing violations, within the BEOL processes, in order that the masks for the FEOL processes or at least for the FEOL processes without contact formation can be released as soon as possible.

There are various conventional procedures for this purpose. Some procedures involve predefining reserve components, for example reserve circuits, in the design. Such reserve circuits may be, for example, signal refresh circuits such as e.g. two inverters connected in series. In order then to be able to correct for example hold violations in BEOL, such reserve circuits are then connected into signal paths by means of corresponding metal connections in the metal layers in order to cause delays and thus to rectify hold violations. If only comparatively few of such reserve components are provided, it can happen that they are not situated where they are required. On the other hand, unused reserve components often bring about leakage currents and are therefore undesired, and moreover occupy chip area, and so an excessive number of said reserve components should not be provided. Therefore, this procedure is associated with disadvantages.

Another possibility that is possible in some cases is the alteration of a signal path in the metal layer, such that the capacitance of the connection is increased, which can likewise bring about a delay. However, for this purpose the signal transmission can be impaired and the signal can become more susceptible to crosstalk from other lines owing to the altered conductor track. This can even worsen a timing violation. Moreover, this is a process that is difficult to automate or carry out primarily in a computer-aided manner, rather manual interventions and often many iterations are possible and/or necessary, and so it is difficult to predict when the circuit design will then actually be completed.

A further possibility is known from U.S. Pat. No. 9,083,325 B2.

Therefore, it is an object of the present application to provide improved possibilities for handling design violations and being able to rectify them at a late stage of the design.

In this regard, a method for designing semiconductor components according to Claim 1, a computer program according to Claim 9, a method for producing semiconductor components according to Claim 10 and a semiconductor component according to Claim 16 are provided. The dependent claims define further embodiments.

Figure 2:
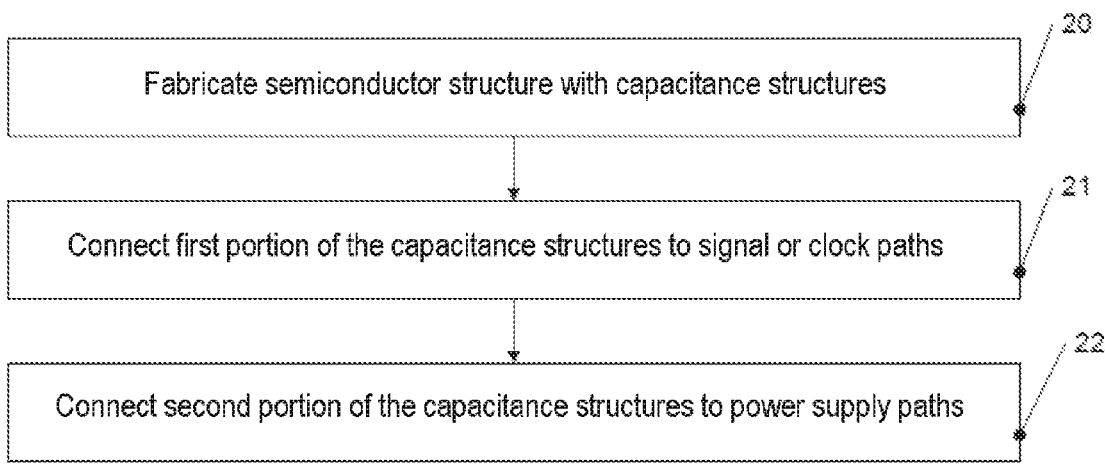
Figures 3A, 3B:
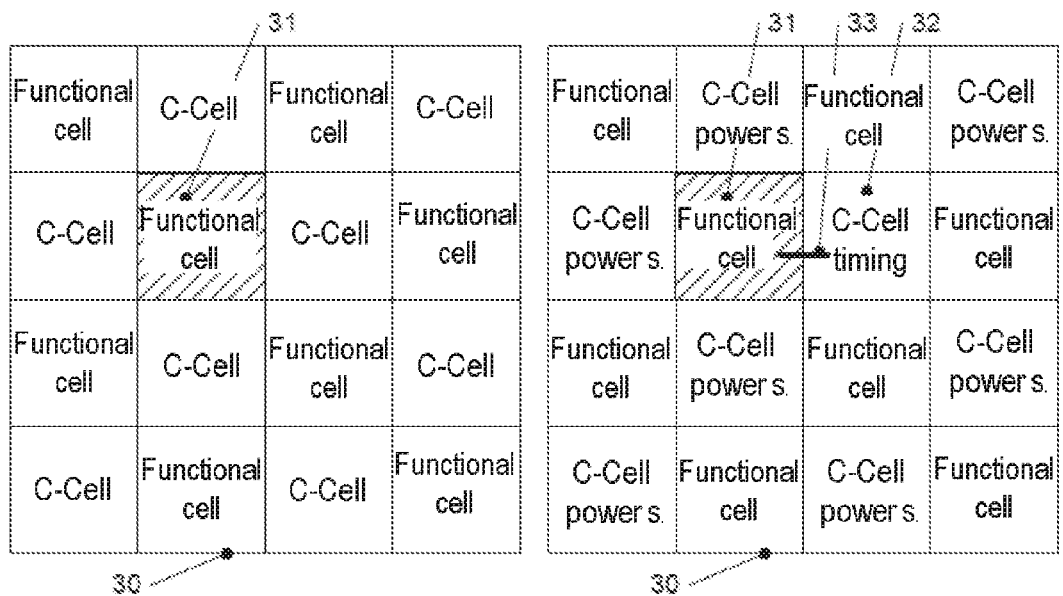

Exemplary embodiments are explained in greater detail below with reference to the accompanying drawings, in which:

FIG. 1 shows a flow diagram for elucidating a method for designing semiconductor components in accordance with one exemplary embodiment, FIG. 2 shows a flow diagram for elucidating a method for producing semiconductor components in accordance with one exemplary embodiment, FIGS. 3A and 3B show schematic views of a semiconductor component in accordance with one exemplary embodiment, and FIGS. 4A to 4D show views of capacitance cell structures in accordance with some exemplary embodiments.

Various exemplary embodiments are explained in detail below. These exemplary embodiments serve merely for elucidation and should not be interpreted as restrictive. In particular, a description of an exemplary embodiment with a multiplicity of features, components or processes should not be interpreted to the effect that all these features, components or processes are necessary for the implementation. Rather, in other exemplary embodiments, some of the features, components or processes can also be omitted and/or replaced by alternative features, components or processes. Features, components or processes of different exemplary embodiments can be combined with one another, unless indicated otherwise. Variants, modifications and details which are described for one of the exemplary embodiments can also be applicable to other exemplary embodiments.

In the description of the following exemplary embodiments, reference is made in some instances to front-end-of-line (FEOL) processes and structures and also to back-end-of-line (BEOL) processes and structures. In this case, as already explained in the introduction, FEOL includes all processes of semiconductor production or structures of the produced semiconductor component up to a first metal layer, but excluding the first metal layer. BEOL includes all processes or structures starting from and including the first metal layer. FEOL without contact formation denotes FEOL processes or FEOL structures with the exception of the contact regions mentioned in the introduction and formation of said contact regions.

A semiconductor component in the context of this matter is any type of semiconductor component, and includes in particular integrated circuits formed on chips.

The following exemplary embodiments deal with possibilities for rectifying or alleviating design violations, in particular timing violations. Timing violations may be in particular set-up or hold violations in digital circuits. In digital circuits it is often necessary for a signal level to maintain a value for a certain time before (set-up time), and a certain time after (hold time) an edge change in a clock signal, in order for example to enable correct sampling of the signal. A set-up violation is present if the signal changes its state within the set-up time, and a hold violation is present if the signal changes its state within the hold time.

Exemplary embodiments of the present application use the fact that such timing violations can be corrected by virtue or the fact that, in the case of hold violations, a capacitance is coupled to a signal path, in which the signal is conducted, in order to delay the signal and, in the case of a set-up violation, a capacitance is coupled to a corresponding clock signal path in order to delay the clock signal. While primarily hold violations are taken as an example below, the techniques described here are also applicable to set-up violations or other design violations.

Exemplary embodiments use the fact that in many circuit designs so-called capacitance filling cells are used to stabilize a power supply network. In this case, the term power supply network is related generally to parts of a semiconductor component which serve to supply the semiconductor circuit with electrical energy, in particular metal lines that are at supply voltage potentials. Such capacitance filling cells are for example conventionally interconnected with a positive voltage supply (for example VDD) and a negative voltage supply (for example VSS) in order to alleviate for example voltage spikes during the switching of switching transistors or similar effects. Such capacitance filling cells are present in relatively large numbers in various conventional designs. In exemplary embodiments, some of these capacitance filling cells are now not interconnected with the power supply network, but rather e.g. with signal paths or clock paths, embodied to compensate for timing violations.

In this way, structures that are present anyway are used to compensate for timing violations. In this case, in exemplary embodiments, only a relatively small portion of said capacitance filling cells is used for the purpose of compensating for design violations, such that the rest of the capacitance filling cells can still perform the function of voltage/current stabilization during switching processes. Such capacitance filling cells are provided in customary circuit designs in particular between standard functional cells which perform the actual component functions of the semiconductor component. This will now be explained in even greater detail with reference to the figures.

FIG. 1 shows a flow diagram for elucidating a design method (in the German text the terms Design and Entwurf are used synonymously in the context of this application) in accordance with one exemplary embodiment. 10 involves designing FEOL semiconductor structures, capacitance structures being provided. The capacitance structures can be embodied in particular in the form of capacitance filling cells between standard functional cells. The capacitance filling cells can have identical FEOL structures, i.e. can be implemented identically in the FEOL processes. During this design phase, if appropriate it is also possible for some timing violations already to be compensated for. After, in some exemplary embodiments, it is possible to release masks for FEOL processes or at least for FEOL processes without contact formation. This enables an early beginning of mask fabrication and a correspondingly early beginning of production in some exemplary embodiments.

Subsequently, 11 involves determining a first design for BEOL structures, in particular metal connections between the capacitance structures. In this case, the capacitance structures in particular as mentioned above are connected as supply capacitances to a power supply network of the component.

12 involves determining timing violations resulting therefrom. This can be carried out for example by means of a conventional static timing analysis (STA), for which commercially available programs are correspondingly available.

13 then involves, for the purpose of compensating for the timing violations, modifying the design of the component such that a first portion of the capacitance structures for compensating for timing violations which were determined in 12 is now connected to signal paths or clock paths instead of to the power supply network. In some exemplary embodiments, only the BEOL design, in particular the configuration of the metal layers, is modified for this purpose. In this case, the FEOL design remains unchanged. In other exemplary embodiments, in addition contact regions are also modified, while the rest of the FEOL design, i.e. FEOL without contact formation, remains unchanged.

Such capacitance structures can delay signals or clock signals and thus rectify timing violations. In addition, in the case of corresponding capacitance structures which for example form capacitances relative to a supply voltage, in contrast to some conventional solutions it is possible to reduce crosstalk from other lines. In the case of pure metal capacitances, by contrast, an acceleration of signals and/or crosstalk could even occur. In particular, such capacitance structures can be connected as an additional load for driver structures, which leads to a signal delay of a signal output by the driver.

In 13, for this purpose, in particular, it is possible to provide an automated search for suitable capacitance structures which, if appropriate in combination with one another, provide a sufficient capacitance to rectify the timing violations determined in 12. In this case, firstly it is possible to determine now much capacitance is required (e.g. in the form of a minimum and a maximum capacitance value) to compensate for the timing violation. It is then possible to carry out a search for suitable capacitance structures in the vicinity of a signal or clock path to which the capacitance structures are to be connected.

A second portion of the capacitance structures, in this case the remaining capacitance structures which were not connected to signal or clock paths in 13, then remains connected as supply capacitances to the power supply network of the component, as mentioned above in the case of 11.

If timing violations which were unable to be rectified in 13 still remain here, they can still be rectified by conventional methods as explained in the introduction. Depending on the implementation, however, for example more than 95% of hold violations can be rectified in the above process 12. By way of example, in a 40-nanometer process in some exemplary embodiments it is hereby possible to rectify all hold violations that are less than 20 ps in a fast process corner.

Consequently, it is possible to rectify the timing violations in the BEOL design (if appropriate with contact regions from FEOL), and the FEOL design can remain at least largely unchanged, such that for example the FEOL masks (if appropriate with the exception of masks for forming the contact regions) can be released early, as already mentioned above. In principle, other design violations can also be rectified in this way, i.e. not just timing violations, provided that capacitance filling cells or portions thereof can be used for the rectification.

The processes 10-13 described hitherto can be implemented in particular in the form of one or more computer programs, for example as a modification of existing design programs, in order in particular to connect the capacitance structures correspondingly as described in 11 and 13. Such computer programs can then run on corresponding computers in order to enable a design of semiconductor components. The computer program can be present for example on an electronically readable data carrier.

14 then involves fabricating semiconductor components on the basis of the design that was created in 10-13, for example in a semiconductor factory. Conventional fabrication processes are used here.

A corresponding production method will now be explained in greater detail with reference to FIG. 2. 20 in FIG. 2 involves forming a semiconductor structure including capacitance structures on a substrate, for example a silicon wafer or other semiconductor wafer. This can consist in FEOL processes, in particular. In this case, the capacitance structures can be formed as capacitance filling cells between functional cells which serve for forming components for the actual function of the semiconductor component.

21 involves electrically connecting a first portion (i.e. a first subset) of the capacitance structures to signal or clock paths, for example via metal connections. Timing violations can thereby be compensated for, as explained with reference to FIG. 1.

22 then involves connecting a second portion (i.e. a second subset) of the capacitance structures, for example the remaining capacitance structures which do not form the first portion, to power supply paths in order to compensate for current or voltage spikes during switching processes for example during operation.

What can be achieved as a result, in particular, is that no unused capacitance structures remain, which can alleviate or eliminate the problems explained in the introduction with regard to leakage currents in some exemplary embodiments.

It should be noted that the processes in 21 and 22 were illustrated as separate blocks in the flow diagram only for explanation purposes. However, the processes can be performed simultaneously, in particular during the formation of metal layers and, if appropriate, the formation of contact regions, such that no separate process steps are necessary here to create the respective connections.

In order to explain this further, FIGS. 3A and 3B schematically illustrate a semiconductor component 30 in accordance with one exemplary embodiment. In this case, FIG. 3A shows the main semiconductor component 30 for example following the FEOL processes (if appropriate without contact formation). Here a multiplicity of functional cells are implemented on the semiconductor component, in which functional cells the actual functions of the semiconductor component are performed and which functional cells may be standard cells from a cell library. Capacitance filling cells (C-cells) are arranged between the functional cells. The number, form and arrangement of these cells in FIGS. 3A and 3B serve merely as an example here. Moreover, it should be noted that the size relationships are not necessarily reproduced correctly in FIGS. 3A and 3B. In particular, the capacitance filling cells can also be significantly smaller than the functional cells, or they can, if appropriate, also be larger than some functional cells. Therefore, FIGS. 3A and 3B should be understood merely as an illustrative schematic example.

In the exemplary embodiment in FIG. 3 it is then assumed that a timing violation would occur at a functional cell 31. In order to rectify this, as illustrated schematically in FIG. 3B, a capacitance filling cell 32, as indicated by a connection 33, within metal layers, is connected to signal paths or clock paths to, from or in the functional cell 31 in such a way that signal delays or clock delays that rectify the timing violation are brought about. By contrast, the rest of the capacitance filling cells are coupled to a power supply network, which is indicated by "C-cell power s." in FIG. 3B.

It should be noted that, for the purpose of rectifying timing violations, in some cases, a plurality of capacitance filling cells can also be interconnected, for example if a larger capacitance is required for rectifying the timing violation. As already emphasized, the illustration in FIGS. 3A and 3B should be understood merely as schematic.

Figures 4A, 4B:
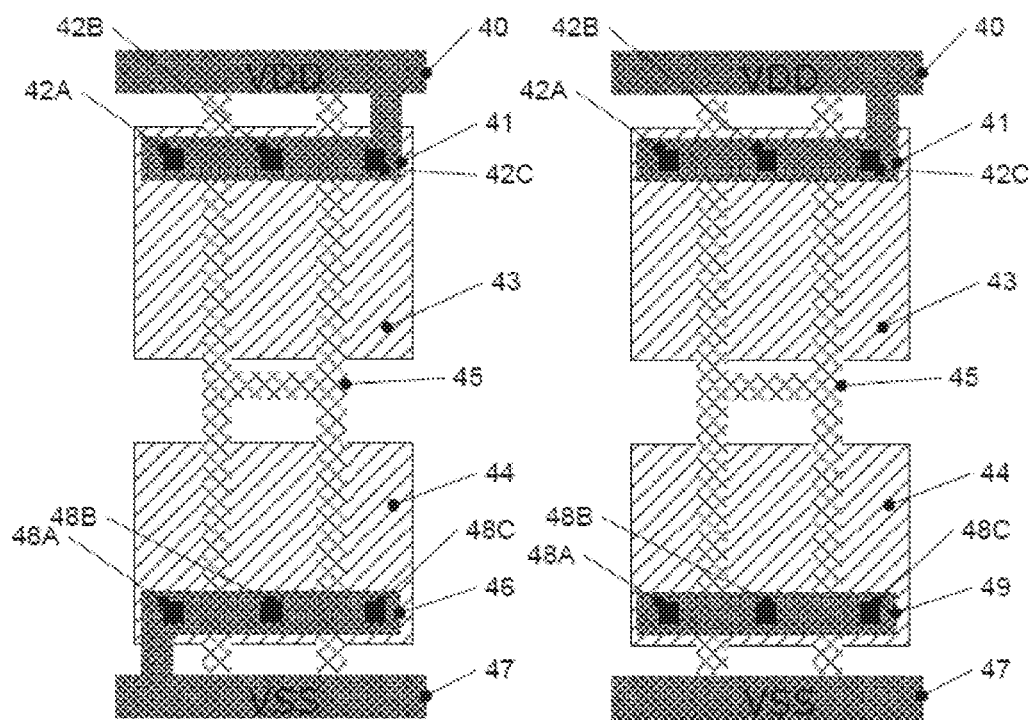

Examples of capacitance structures are explained next with reference to FIGS. 4A to 4D. In this case, FIGS. 4A to 4D merely show one possible example for implementing capacitance structures for illustration purposes, and other structures are also possible as long as a capacitance is provided by them. In FIGS. 4A to 4D, FIG. 4A shows a use of the capacitance structure in a power supply network, and FIGS. 4B to 4D show various modifications of FIG. 4A for coupling to signal paths in order to rectify timing violations.

In FIGS. 4A to 4D, mutually corresponding elements bear the same reference signs and will not be explained repeatedly. In particular, only the differences with respect to FIG. 4A are explained for FIGS. 4B to 4D.

The capacitance structure in FIG. 4A can be formed for example in and/or on a silicon semiconductor. It comprises a p-doped diffusion region 43, an n-doped diffusion region 44 and a polysilicon structure 45, which is H-shaped in the example illustrated, but can also assume other shapes. The p-doped diffusion region 43, the n-doped diffusion region 44 and the polysilicon structure 45 can be formed for example in FEOL processes.

40 designates a power supply path which is at a first supply voltage VDD, and 47 designates a power supply path which is at a second supply voltage VSS, wherein VDD as usual is greater than VSS. By way of example, VDD can be +5 V, +3.5 V, +1.3 V or less, and VSS can be 0 V, other values also being possible.

In the case of FIG. 4A, a metal region 41 is coupled to the power supply path 40, and a metal region 46 is coupled to the power supply path 47. The metal region 41 is additionally coupled to the diffusion region 43 via contact regions 42A, 42B, 42C. In a similar manner, the metal region 46 is electrically connected to the diffusion region 44 via contact regions 48A, 48B and 48C.

In this regard, the structure in FIG. 4A forms a capacitance between the power supply path 40 and the power supply path 47, which capacitance, as already explained, can serve for alleviating current or voltage spikes during switching processes of transistors.

If the capacitance structure of a specific cell is then required for rectifying timing violations or other design violations, the design of the metal layers and, if appropriate, of the contact regions in FIG. 4A is modified.

The metal regions (40, 41, 46, 47) explained can be formed in BEOL processes. If only the metal regions are modified, the FEOL processes can be left unchanged. If the contact regions (42A to 42C, 48A to 48C) are additionally modified, the FEOL processes without contact formation can be left unchanged.

A first example of such a modification is illustrated in FIG. 4B. In FIG. 4B, in contrast to FIG. 4A, the connection between the metal region 46 and the supply path 47 is disconnected. The metal region can thus serve as a signal terminal 49 which is connected to corresponding signal paths or clock paths in order to rectify timing violations. In this example, only metal regions are modified.

A further possibility is illustrated in FIG. 4C. Here the contact regions 48A to 48C were removed in order to electrically isolate the supply voltage path 47 from the structure. An additional metal region 410 is provided, which is electrically coupled to the diffusion region 44 via contact regions 411A, 411B and 411C. In this case, the number of contact regions should be understood merely as an example and can vary depending on the structure.

The metal region 410 then serves as a signal terminal which is coupled to corresponding signal or clock paths via metal tracks in order to rectify timing violations. In the exemplary embodiment in FIG. 4C, care must be taken to ensure that the additional metal region 410 does not clash with existing metal connections, while no additional metal region is necessary in the case of FIG. 4B.

It should be noted that, in FIGS. 4B and 4C, the supply voltage path 47 is in each case electrically isolated from the diffusion region 44, and a capacitance is then formed between the respective metal region 49 or 410 serving as a signal terminal and the supply voltage path 40. The opposite procedure is also possible, in which the electrical connection between the supply voltage path 40 and the diffusion region 43 is disconnected.

A further possibility is illustrated in FIG. 4D. In FIG. 4D, the structures from FIG. 4A are still present in their entirety, and an additional metal region 412 is provided, which is electrically coupled to the polysilicon structure 35 via contact regions 413A, 413B. In this case, the metal region 412 serves as a signal terminal and is coupled to a signal path or clock signal path for rectifying timing violations.

Here, therefore, a capacitance relative to VDD and a capacitance relative to VSS are formed in parallel connection, which leads overall to a higher capacitance than in the case of FIGS. 4B and 4C. Conversely, higher leakage currents than in the case of FIGS. 4B and 4C can occur in the case of the structure in FIG. 4D. Therefore, a suitable structure can be selected depending on the requirements.

In FIGS. 4C and 4D, both the metal regions and the contact regions are modified here.

Capacitance structures as shown in FIGS. 4A-4D can also be used for rectifying design violations other than timing violations. By way of example, in the case of a so-called process antenna violation, a diode formed between the diffusion region 44 and a silicon substrate or the definition region 43 and a substrate can be interconnected with signal paths in order to alleviate such violations. Consequently, the use of the techniques described is not restricted to the rectification of timing violations.

In view of the above descriptions of variants and modifications it is evident that the exemplary embodiments illustrated should not be interpreted as restrictive.

The invention claimed is:

1. A method for designing a semiconductor component, the method comprising:
designing front-end-of-line structures of the semiconductor component including a multiplicity of capacitance structures,
determining design violations,
designing connections of a first portion of the multiplicity of capacitance structures for compensating for the design violations, and
designing connections of a second portion of the multiplicity of capacitance structures to a supply network of the semiconductor component.

2. The method according to claim 1, wherein the multiplicity of capacitance structures have front-end-of-line structures that are identical in each case among one another at least apart from contact regions.

3. The method according to claim 1, wherein the design violations comprise timing violations, and wherein designing connections of the first portion of the capacitance structures comprises a design of connections of the first portion of the capacitance structures to signal paths or clock paths.

4. The method according to claim 1, wherein the second portion of the capacitance structures comprises all capacitance structures of the multiplicity of capacitance structures which do not belong to the first portion of the capacitance structures.

5. The method according to claim 1, wherein the capacitance structures are capacitance filling cells between functional cells which implement a function of the semiconductor component.

6. The method according to claim 1,
wherein designing the connections of the second portion of the multiplicity of capacitance structures to the supply network of the semiconductor component comprises designing connections of all capacitance structures to the supply network before determining design violations, and
wherein designing connections of the second portion of the capacitance structures comprises modifying the connections of the second portion of the capacitance structures depending on the design violations determined.

7. The method according to claim 1, further comprising determining in an automated manner which capacitance structures belong to the first portion, on the basis of the design violations determined.

8. The method according to claim 1, further comprising fabricating semiconductor components on the basis of the design.

9. A method for fabricating semiconductor components, the method comprising:
fabricating a semiconductor structure with a multiplicity of capacitance structures in front-end-of-line processes,
connecting a first portion of the capacitance structures to signal or clock paths in back-end-of-line processes, and
connecting a second portion of the capacitance structures to power supply paths in the back-end-of-line processes.

10. The method according to claim 9, wherein the multiplicity of capacitance structures have front-end-of-line structures that are identical among one another at least apart from contact regions.

11. The method according to claim 9, wherein the capacitance structures are fabricated as capacitance filling cells between functional cells which implement functions of the semiconductor component.

12. The method according to claim 9, wherein fabricating the multiplicity of capacitance structures comprises forming diffusion regions in a semiconductor substrate.

13. The method according to claim 9, wherein fabricating the multiplicity of capacitance structures comprises forming polysilicon structures.

14. The method according to claim 9, wherein connecting the first portion and connecting the second portion are carried out in common process steps.

15. The method according to claim 1,
wherein the semiconductor component further comprises a multiplicity of functional cells,
wherein determining the design violations comprises determining a first design violation for a first functional cell of the multiplicity of functional cells, and
wherein designing the connections of the first portion of the multiplicity of capacitance structures comprises designing a first connection between the first functional cell and a first capacitance structure of the multiplicity of capacitance structures for compensating for the first design violation.

16. The method according to claim 15, wherein determining the first design violation for the first functional cell comprises determining a timing violation for the first functional cell based on a static timing analysis.

17. The method according to claim 16,
wherein determining the timing violation for the first functional cell comprises determining a hold violation for the first functional cell, and
wherein designing the first connection comprises designing the first connection between a path of a non-clock signal to the first functional cell and a first capacitance structure to delay an arrival of the non-clock signal at the first functional cell.

18. The method according to claim 16,
wherein determining the timing violation for the first functional cell comprises determining a set-up violation, and
wherein designing the first connection comprises designing the first connection between a path of a clock signal to the first functional cell and a second capacitance structure to delay an arrival of the clock signal at the first functional cell.

* * * * *